(12) United States Patent
Wang et al.

(10) Patent No.: US 9,646,934 B2
(45) Date of Patent: May 9, 2017

(54) INTEGRATED CIRCUITS WITH OVERLAY MARKS AND METHODS OF MANUFACTURING THE SAME

(71) Applicant: GLOBALFOUNDRIES Singapore Pte. Ltd., Singapore (SG)

(72) Inventors: Shijie Wang, Singapore (SG); Yong Feng Fu, Singapore (SG); Siew Yong Leong, Singapore (SG); Lei Wang, Singapore (SG); Alex See, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/721,121

(22) Filed: May 26, 2015

(65) Prior Publication Data
US 2016/0351507 A1 Dec. 1, 2016

(51) Int. Cl.
*H01L 23/544* (2006.01)
*H01L 21/3105* (2006.01)

(52) U.S. Cl.
CPC ........ *H01L 23/544* (2013.01); *H01L 21/3105* (2013.01)

(58) Field of Classification Search
CPC ............................ H01L 23/544; H01L 21/3105
See application file for complete search history.

(56) References Cited

U.S. PATENT DOCUMENTS

| | | | | |
|---|---|---|---|---|
| 6,106,981 A * | 8/2000 | Okamoto | ............... | G03F 1/144 430/5 |
| 6,184,143 B1 * | 2/2001 | Ohashi | .............. | H01L 21/76819 257/E21.244 |
| 6,566,249 B1 * | 5/2003 | Koutny, Jr. | ......... | H01L 21/7684 257/E21.583 |
| 9,159,670 B2 * | 10/2015 | Kim | ...................... | H01L 21/768 |
| 2009/0139760 A1 * | 6/2009 | Tanaka | ................... | H05K 1/162 174/264 |
| 2010/0283128 A1 * | 11/2010 | Chen | ...................... | H01L 21/78 257/620 |
| 2013/0009269 A1 * | 1/2013 | Testa | ................. | H01L 27/14632 257/448 |
| 2014/0264631 A1 * | 9/2014 | Wei | ................... | H01L 21/76224 257/401 |

* cited by examiner

*Primary Examiner* — Marc Armand
*Assistant Examiner* — Sue Tang
(74) *Attorney, Agent, or Firm* — Lorenz & Kopf, LLP (57) ABSTRACT

Integrated circuits and methods for manufacturing the same are provided. An integrated circuit includes a base dielectric layer, a first dielectric layer overlying the base dielectric layer, and a second dielectric layer overlying the first dielectric layer. A first overlay mark is positioned within the first dielectric layer, and a second overlay mark is positioned within the second dielectric layer, where the second overlay mark is offset from the first overlay mark. First and second blocks are positioned within the base dielectric layer, where the first overlay mark directly overlays the first block and the second overlay mark directly overlays the second block.

19 Claims, 7 Drawing Sheets

INTEGRATED CIRCUITS WITH OVERLAY MARKS AND METHODS OF MANUFACTURING THE SAME

TECHNICAL FIELD

The technical field generally relates to integrated circuits with overlay marks and methods for manufacturing the same, and more particularly relates to integrated circuits with a block underlying an overlay mark and methods of manufacturing such integrated circuits.

BACKGROUND

The semiconductor industry is continuously moving toward the fabrication of smaller and more complex integrated circuits with higher performance. During a typical manufacturing process, several stacked layers of dielectric materials are formed during back end of line (BEOL) fabrication. The stacked layers of dielectric materials include interconnects, contacts, and various components that electrically connect electronic components of the integrated circuit in a desired pattern. These interconnects, contacts, and other components are aligned to make the proper electrical connections. Improper alignment can result in shorts or other malfunctions in the integrated circuit. Overlay marks (sometimes referred to as alignment marks) are generally added at select locations in the stacked layers of dielectric materials to verify that each subsequent layer is properly aligned. The overlay marks are formed in adjacent stacked layers and compared to each other to verify that the adjacent layers are properly aligned. Many different types of overlay marks can be used, such a series of elongated rectangular bodies that are intended to line up with another series of elongated rectangular bodies in an adjacent layer, or a box shape in one layer that is intended to line up with a frame in an adjacent layer, or a box shape in one layer that is intended to line up with a box shape in another layer. The BEOL fabrication process can be adjusted if the overlay marks indicate that the adjacent layers are misaligned.

Overlay marks are generally formed using lithographic techniques. During lithographic processing, a photoresist layer is formed overlying one or more layers of dielectric material, where the layers of dielectric materials overlay various electronic components. Some of the electronic components include metals that can reflect light, such as copper, aluminum, or tungsten. When the overlay marks are inspected to determine alignment issues, incident light can travel through the one or more layers of dielectric materials and reflect back to a sensing device from reflective parts of the electronic components positioned underneath the overlay marks. The reflected light can shift the apparent or perceived position of the alignment marks during inspection, thereby resulting in unwanted measurement errors. A block may be formed underlying a set of overlay marks and overlying electronic components with reflective parts to minimize reflection of the light from underlying components in an unplanned and random manner. As such, the block can improve the measurement accuracy for the overlay marks during inspection. The block is a pad that is typically formed at the same time as interconnects, and is therefore formed from the same material as the interconnects. The block is generally electrically isolated by layers of dielectric material so as not to interfere or influence the operation of the integrated circuit.

In many embodiments, overburden produced during the formation of the block is removed through chemical mechanical planarization (CMP). For many block materials, the upper surface of the block is removed at a faster rate than the adjacent dielectric material. This results in the block having a dished upper surface, with the edges of the block being thicker than the center area of the block that is further from the dielectric material. As a result, some of the overlay marks may be positioned over a sloped area of the dished upper surface of the block. The sloped area of the dished upper surface of the block results in an unintended angled reflection of the light that passes through dielectric layers that overlie the sloped area. The overlay marks are inspected during metrology to determine the alignment of adjacent layers, and light is used to inspect and measure the alignment. Incident light travels through the dielectric layers during metrology, and the unintended angled reflection can result in measurement errors because the overlay marks appear to be shifted from their actual location. The dishing also changes the dielectric layer thickness overlying the block, and the varying thickness can also produce metrology errors in some cases.

Accordingly, it is desirable to provide integrated circuits and methods of manufacturing integrated circuits with little or no shift in the apparent position of overlay marks during inspection. In addition, it is desirable to provide integrated circuits and methods of manufacturing integrated circuits with reduced dishing of the block, and/or with symmetrical dishing of the block such that the appearance of an overlay mark geometric center is close to the actual location of the overlay mark geometric center. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods for manufacturing the same are provided. In an exemplary embodiment, an integrated circuit includes a base dielectric layer, a first dielectric layer overlying the base dielectric layer, and a second dielectric layer overlying the first dielectric layer. A first overlay mark is positioned within the first dielectric layer, and a second overlay mark is positioned within the second dielectric layer, where the second overlay mark is offset from the first overlay mark. First and second blocks are positioned within the base dielectric layer, where the first overlay mark directly overlays the first block and the second overlay mark directly overlays the second block.

An integrated circuit is provided in another embodiment. A first dielectric layer overlies a base dielectric layer. A first overlay mark is positioned within the first dielectric layer, and a first label is positioned within the first dielectric layer proximal to the first overlay mark. A first block is positioned within the base dielectric layer, wherein the first overlay mark directly overlies the first block and the first label directly overlies a portion of the base dielectric at a position other than that of the first block.

A method of producing an integrated circuit is provided in yet another embodiment. The method includes forming a first block cavity and a second block cavity within a base dielectric layer, and forming a first and second block in the first and second block cavities, respectively. A first dielectric layer is formed overlying the base dielectric layer, and a first overlay mark is formed directly overlying the first block in the first dielectric layer. A second dielectric layer is formed overlying the first dielectric layer, and a second overlay mark is formed in the second dielectric layer directly overlying the second block.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Figure 1:
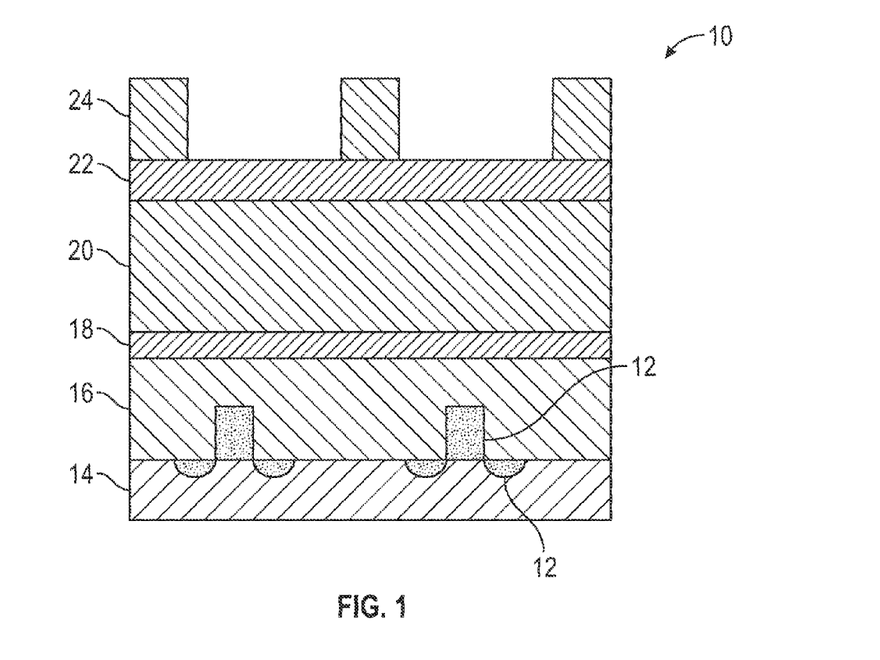
FIGS. 1-4 and 6-8 are cross-sectional views illustrating portions of an integrated circuit and methods for its fabrication in accordance with an exemplary embodiment.

According to various embodiments described herein, and with reference to FIG. 1, an integrated circuit 10 includes one or more electronic components 12 within and/or overlying a substrate 14. As used herein, the term "overlying" means "over," such that an intervening layer may lie between the electronic component 12 and the substrate 14, and "on," such that the electronic component 12 may make physical contact with the substrate 14. Moreover, the term "directly overlying" as used herein means a line perpendicular to the substrate 14 passes through an upper component and also passes through a lower component, such that at least a portion of the upper component is directly over at least a portion of the lower component. Perpendicular to the substrate 14 is referred to herein as "vertical" based on a horizontal substrate 14, but it is to be understood that the substrate 14 may not be horizontal at all times. The electronic component 12 may be a wide variety of components, such as transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; interposers; or other suitable elements.

As used herein, the term "substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is a monocrystalline silicon substrate. The silicon substrate 14 may be a bulk silicon wafer (as illustrated) or may be a thin layer of silicon on an insulating layer (commonly known as silicon-on-insulator or SOI) that, in turn, is supported by a carrier wafer.

In an embodiment and as illustrated in FIG. 1, a component dielectric layer 16 overlies the electronic components 12 and the substrate 14, and an optional component barrier low-k (BLOk) layer 18 overlies the component dielectric layer 16. A wide variety of electrically insulating materials may be used for the component dielectric layer 16, such as silicon dioxide. Silicon dioxide may be formed by several processes, such as chemical vapor deposition using silane and oxygen. The component BLOk layer 18 may be formed of low-k dielectric material. As used herein a "low k dielectric material" is a dielectric material with a dielectric constant (k) of from about 1.0 to about 2.7. The component BLOk layer 18 may be used as an etch stop, and may serve as a barrier to copper diffusion during annealing steps. In an exemplary embodiment, the component BLOk layer 18 is formed using plasma enhanced chemical vapor deposition with trimethyl silane, where the resulting component BLOk layer 18 includes silicon, carbon, and hydrogen.

In an exemplary embodiment, a base dielectric layer 20 is formed overlying the component BLOk layer 18. The base dielectric layer 20 may include a wide variety of electrically insulating materials. In some embodiments, the base dielectric layer 20 includes a low k dielectric material, but other electrically insulating materials may be used in alternate embodiments. A porous organosilicate glass (porous OSG) is one example of a low k dielectric material that may be used. OSG may be deposited as a film with a density of about 1.5 grams per cubic centimeter ($g/cm^3$). Porosity may be added to the OSG to produce porous OSG insulating materials with a dielectric constant below about 2.7, where the void space in the pores has a dielectric constant of about 1.0. Porous OSG can be created by combining pore-forming compounds (called "porogens") with the silicon-containing precursors during the deposition process, and then removing the porogen after the base dielectric layer 20 is formed. The porogen may be an organic compound that can be vaporized or otherwise removed from the base dielectric layer 20. Examples of silicon-containing precursors include, but are not limited to, tetramethylcyclotetrasiloxane (TMCTS), diethoxymethylsilane (DEMS), dimethyldimethoxysilane (DMDMOS), trimethylsilane (3MS), TEOS, triethoxysilane, di-tert-butoxysilane, and di-tert-butoxydiacetoxysilane. Other dielectric materials may be used in alternate embodiments.

In an embodiment and referring again to FIG. 1, a base hard mask 22 is formed overlying the base dielectric layer 20. The base hard mask 22 may include silicon nitride, which can be formed with low pressure chemical vapor deposition using ammonia and dichlorosilane. In alternate embodiments, the base hard mask 22, and other hard masks described below, are a spin-on hard mask, such as an organic dielectric material. Spin-on organic dielectric hard mask materials are commercially available, and may be based on various chemistry, such fullerene compounds or compounds with aryl groups having hydroxyl and/or carboxylic functional groups. The spin-on organic hard masks may be cured after spin coating, such as by heating to about 220 to about 400 degrees centigrade (° C.). In an embodiment, a base photoresist 24 is formed and patterned overlying the base hard mask 22, as illustrated. The base photoresist 24 (and other photoresist layers described below) can be formed by spin coating, and the base photoresist 24 is patterned by exposure to light or other electromagnetic radiation through a mask with transparent sections and opaque sections. The light causes a chemical change in the photoresist such that either the exposed portion or the non-exposed portion can be selectively removed. The base photoresist 24 (and other photoresist layers described below) may optionally include a top and/or bottom anti-reflective coating (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. The desired locations are removed with an organic solvent as is known in the art, and the base photoresist 24 remains overlying the other areas of the base hard mask 22 and the base dielectric layer 20.

Figure 2:
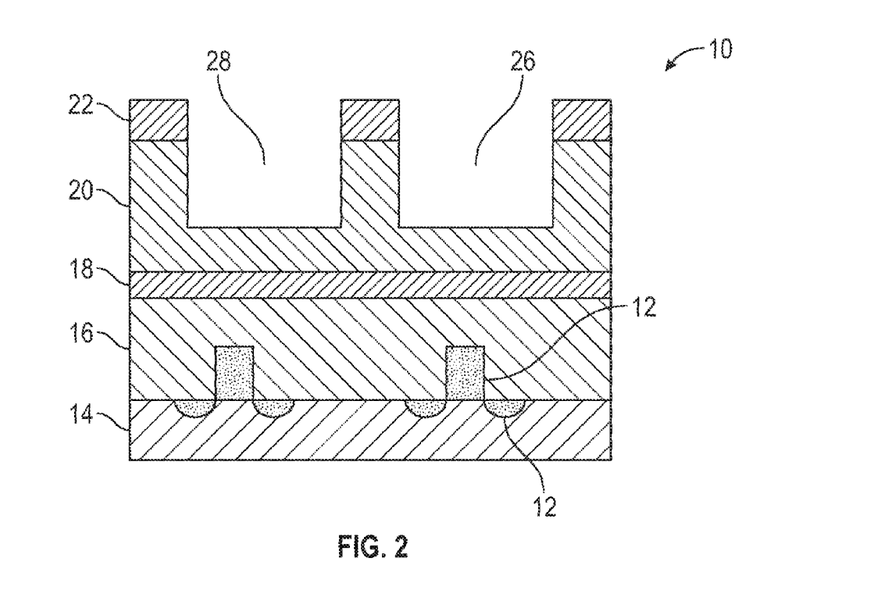

In an embodiment and referring to FIG. 2, with continuing reference to FIG. 1, the base hard mask 22 is patterned by removing exposed portions using the patterned base photoresist 24 as a mask. In embodiments where the base hard mask 22 includes silicon nitride, a wet etch using hot phosphoric acid can be used to remove the exposed base hard mask 22. The base hard mask 22 underlying the base photoresist 24 remains in place, because it is protected by the base photoresist 24. After the base hard mask 22 is patterned, the remaining base photoresist 24 is removed, such as with an oxygen-containing plasma. Next, a first block cavity 26 and a second block cavity 28 are formed in the base dielectric layer 20, such as with an etch selective to the material of the base dielectric layer 20 over the material of the base hard mask 22. In an exemplary embodiment with the base dielectric layer 20 including OSG and the base hard mask 22 including silicon nitride, a plasma etch with hexafluorobutadiene, oxygen, and monofluoro methane can be used. However, it is to be appreciated that other etch chemistries that are selective to the OSG over the silicon nitride in the base hard mask 22 can also be used. Many selective etchants are available for alternative embodiments where the base hard mask 22 and the base dielectric layer 20 have different compositions than as described above. The first and second block cavities 26, 28 are etched anisotropically for a controlled period of time such that some of the base dielectric layer 20 remains disposed over the component BLOk layer 18 in the first and second block cavities 26, 28.

Figure 3:
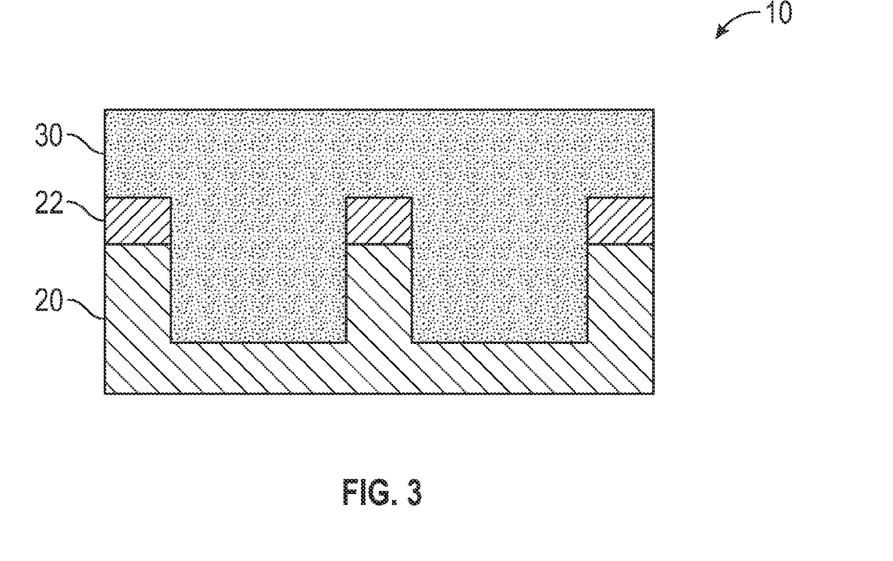

Reference is made to FIGS. 2 and 3, where the component BLOk layer 18, the component dielectric layer 16, electronic components 12, and the substrate 14 from FIGS. 1 and 2 are not illustrated in FIG. 3 and subsequent drawings to simplify the drawing subject matter. A block fill material 30 is deposited in the first and second block cavities 26, 28 and overlying the base hard mask 22. The block fill material 30 is opaque, such that about 99 percent or more of the light from a lithography light source does not pass through the block fill material 30. In an exemplary embodiment, the block fill material 30 includes copper, which can be deposited by electroplating. In alternate embodiments, the block fill material 30 can include materials other than copper, such as copper alloys or materials that do not include copper. The block fill material 30 may form a reflective surface in some embodiments, but it is also possible for the block fill material 30 to absorb light without reflecting it. The block fill material 30 may be deposited simultaneously with other components, so the block fill material 30 may be the same material used in other components formed at the same time, such as interconnects or contacts as described below.

Figure 4:
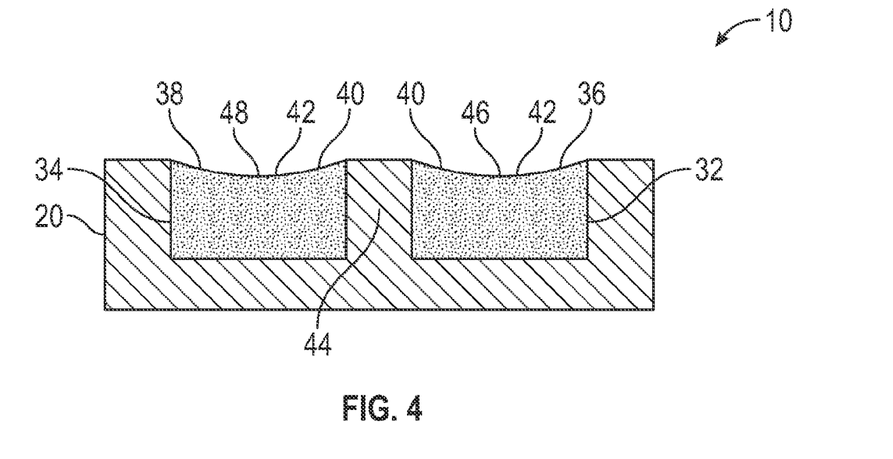

The overburden of the block fill material 30 and the remaining base hard mask 22 are removed, as illustrated in an exemplary embodiment in FIG. 4 with continuing reference to FIG. 3. Removal of the overburden forms an opaque first block 32 and an opaque second block 34 that are electrically isolated, so the first and second blocks 32, 34 are separate components that are physically isolated. The block fill material 30 and the remaining base hard mask 22 may be removed by chemical mechanical planarization. In some embodiments, the material of the first and second blocks 32, 34 is removed at a faster rate than the material of the base dielectric layer 20, resulting in dishing of a first block upper surface 36 and a second block upper surface 38. The dished first and second block upper surfaces 36, 38 include a curved area 40 and a trough area 42, where the trough area 42 is about in the center of each of the first and second blocks 32, 34, and the curved area 40 is positioned between the outer perimeter and the central portion of each of the first and second blocks 32, 34. A pillar 44 separates the first and second blocks 32, 34, where the pillar 44 is contiguous with the base dielectric layer 20 and formed of the same material as the base dielectric layer 20. In some embodiments, there is no seam between the pillar 44 and the base dielectric layer 20. The distance between the first and second blocks 32, 34 is about 4 micrometers or less, or about 2 micrometers or less, or about 1 micrometer or less in various embodiments. The distance between the first and second blocks 32, 34 is the width of the pillar 44, so the pillar 44 fills the area between the first and second blocks 32, 34.

Figure 5:
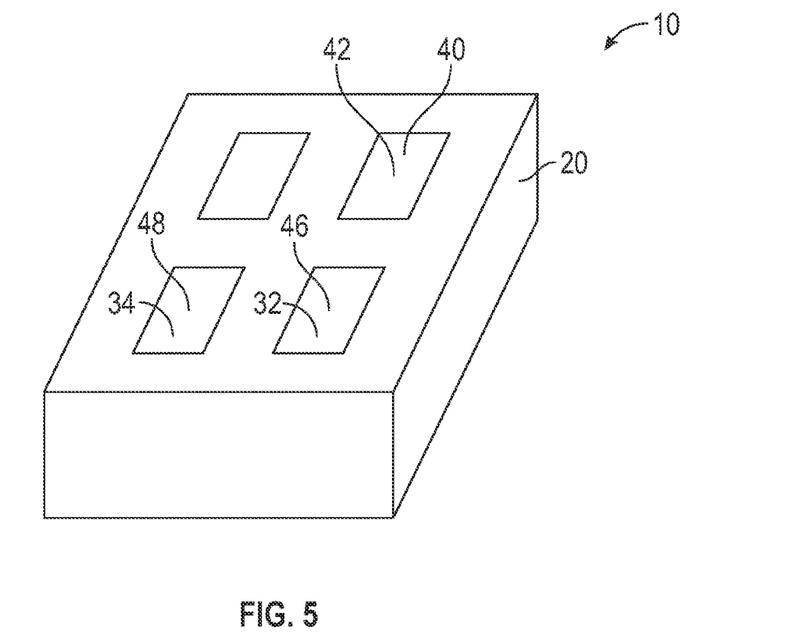
FIG. 5 is a perspective view of a portion of an integrated circuit of FIG. 4 illustrating block positioning in a base dielectric layer.

In some embodiments, the integrated circuit 10 includes a plurality of blocks (including the first and second blocks 32, 34), as illustrated in a perspective view in FIG. 5 with continuing reference to FIG. 4. The first block 32 has a first block geographic center 46 located at about a center of the first block 32. The second block 34 also has a second block geographic center 48, and so on for the other blocks. As used herein, the term "geographic center" refers to a geometric mid-point of an object (or a plurality of objects) taken on a cross-section of the object parallel with the substrate 14 (the substrate 14 is illustrated in FIGS. 1 and 2), with no regard to the mass or depth of the object. The first and second block geometric centers 46, 48 are positioned within the trough area 42 of the dished first and second block upper surfaces 36, 38 because the dish shape is essentially symmetric on the first and second block upper surfaces 36, 38.

Figure 6:
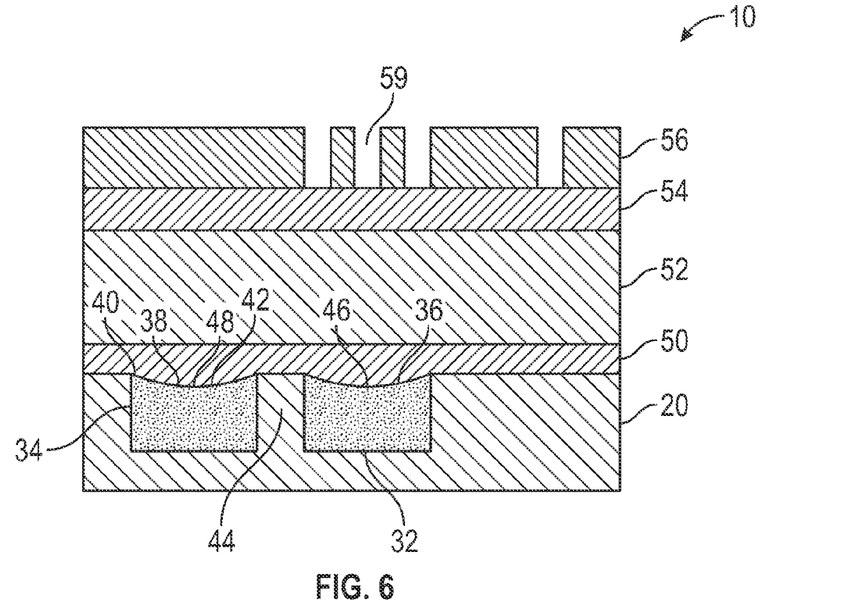

Referring to an exemplary embodiment illustrated in FIG. 6 when the first and second blocks 32, 34 include copper, an optional base BLOk layer 50 is formed overlying the base dielectric layer 20 and the first and second blocks 32, 34. The base BLOk layer 50 helps control diffusion of copper from the first and second blocks 32, 34, and is formed as described above for the component BLOk layer 18 illustrated in FIGS. 1 and 2. BLOk layers may also be formed between other layers in some embodiments, although no further BLOk layers are illustrated or described to simplify this description.

A first dielectric layer 52 is formed overlying the optional base BLOk layer 50, where the first dielectric layer 52 is electrically insulating. If the optional base BLOk layer 50 is not used, the first dielectric layer 52 is formed overlying the base dielectric layer 20 and the first and second blocks 32, 34. The first dielectric layer 52 may include a wide variety of electrically insulating materials, such as porous OSG, silicon dioxide, or others, as described above for the component dielectric layer 16 illustrated in FIGS. 1 and 2. A first hard mask 54 is formed overlying the first dielectric layer 52, and a first photoresist layer 56 is formed overlying the first hard mask 54. The first photoresist layer 56 is patterned as desired for various components to be formed in the first dielectric layer 52, in the same manner as described above. The first hard mask 54 may include silicon nitride, as described above for the base hard mask 22 illustrated in FIGS. 1-3, but other materials are used in alternate embodiments.

Figure 7:
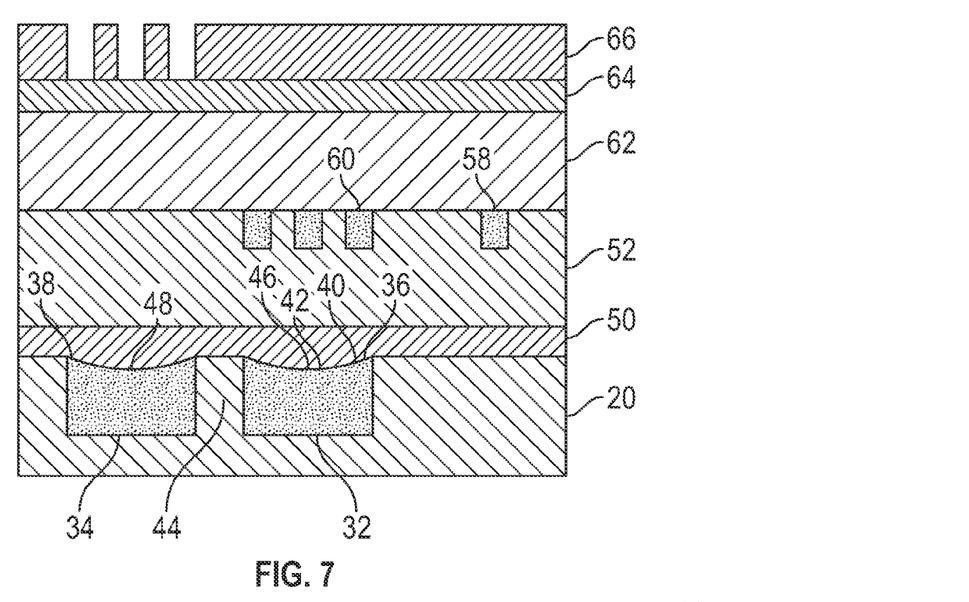

A first overlay mark 60 is formed within the first dielectric layer 52, as illustrated in an exemplary embodiment in FIG. 7 with continuing reference to FIG. 6. As used herein, "within" means that at least a portion of the recited element is surrounded by material of the layer within which the recited element is disposed, e.g., the recited element is at least partially embedded in the bulk of the layer within which the recited element is disposed. A plurality of first overlay marks 60 may be disposed within the first dielectric layer 52, where the first overlay mark(s) 60 directly overlay the first block 32. The first hard mask 54 is patterned for the first overlay mark(s) 60. In an exemplary embodiment, the first hard mask 54 is patterned by etching the first hard mask 54 through pattern gaps 59 in the first photoresist layer 56. The first photoresist layer 56 may be removed after the hard mask 54 is patterned. A cavity (not illustrated) is then formed in the first dielectric layer 52 for the first overlay mark(s) 60. In an exemplary embodiment, the first dielectric layer 52 is anisotropically etched for a controlled period of time such that the cavity does not extend all the way through the first dielectric layer 52. After the cavity (not illustrated) for the first overlay mark(s) 60 is formed, material is deposited in the cavity, and the overburden and the remaining first hard mask 54 may be removed by chemical mechanical planarization. In an exemplary embodiment, the overlay mark(s) 60 include copper, but other materials can also be used. This brief summary of one embodiment of a formation process is similar to that described above for the formation of the first and second blocks 32, 34.

Other components may be formed within the first dielectric layer 52 at the same time as the first overlay mark 60, such as interconnects 58 or contacts (where contacts are not illustrated). Components that are formed in a single step include the same material. As such, the interconnect 58 or other components that are simultaneously formed with the first overlay mark(s) 60, as well as the first overlay mark(s) 60, include the same material. The interconnect 58 or other components may be used in the integrated circuit 10. A second dielectric layer 62 is formed overlying the first dielectric layer 52, the first overlay mark 60, and other components such as interconnects 58 formed within the first dielectric layer 52. A second hard mask 64 is formed overlying the second dielectric layer 62, and a second photoresist layer 66 is formed overlying the second hard mask 64 in the same manner as described above for the first dielectric layer 52, the first hard mask 54, and the first photoresist layer 56.

Figure 8:
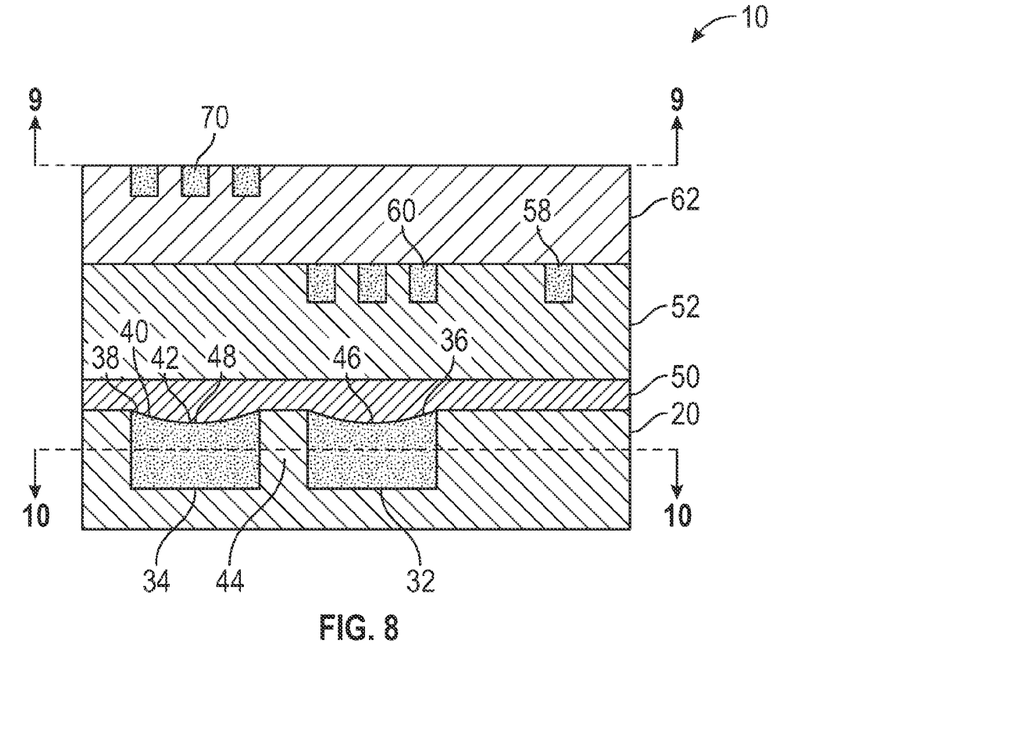

Reference is made to the exemplary embodiment in FIG. 8 with continuing reference to FIG. 7. A second overlay mark 70 is formed in the second dielectric layer 62 in the same manner as the first overlay mark 60 was formed in the first dielectric layer 52. Formation of the second overlay mark 70 begins with patterning of the second photoresist layer 66. The second overlay mark 70 is offset from the first overlay mark 60 to facilitate simultaneous viewing. The term "offset," as used herein, means a vertical line (perpendicular to the substrate 14, as defined above) will not pass through both reference objects in at least some locations. In some embodiments, the second overlay mark 70 does not directly overlaying the first overlay mark 60 at any locations. Other components may be simultaneously formed in the second dielectric layer 62 while the second overlay mark 70 is formed, such as interconnects 58 (illustrated in the first dielectric layer 52) or contacts (not illustrated.) A plurality of second overlay marks 70 may be formed in some embodiments, and the second overlay mark(s) 70 is/are positioned directly overlying the second block 34. The second block 34 is smaller than a larger block that covers the area of both the first and second block 32, 34, which increases the accuracy of the patterning of the second photoresist layer 66, as described above.

In an exemplary embodiment, the first and second dielectric layers 52, 62 are translucent, where the term "translucent" as used herein means a material that allows light from a lithography light source to pass at an intensity sufficient enough to reflect and effect a chemical reaction in an overlying layer of photoresist. As such, a "translucent" first and/or second dielectric layer 52 includes transparent materials. The relative positions of the first and second overlay marks 60, 70 are compared in a metrology step. During metrology, the location of the first and second overlay marks 60, 70 may appear to be different than the actual location of the first and second overlay marks 60, 70 due to the dishing of the first and second blocks 32, 34. Incident light used in the metrology process may pass through the first and second dielectric layers 52, 62 and reflect off the surface of the first and second block 32, 34, which can cause a shift in the apparent position of the first and/or second overlay marks 60, 70 if the reflected light is offset by the curved area 40. The first and second blocks 32, 34 are smaller than a block that encompasses the entire area of the first and second blocks 32, 34, so the first and second blocks 32 have less dishing than a larger block that would have encompassed the area of the first and second block 32, 34. The reduced angle of the curved area 40 compared to larger blocks results in more accurate determination of the position of the first and second overlay marks 60, 70.

Figure 9:
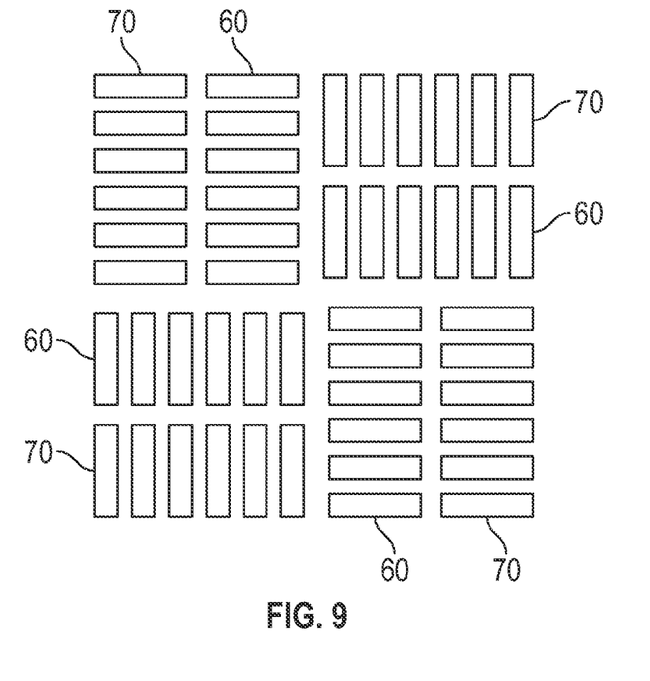
FIG. 9 is a top view illustrating the first and second overlay marks.

An exemplary embodiment of the first and second overlay marks 60, 70 is illustrated in a top view in FIG. 9, with continuing reference to FIG. 8, where FIG. 9 is taken along section line 9-9 from FIG. 8. In the embodiment illustrated in FIG. 9, the first and second overlay marks 60, 70 are elongated bodies with a generally rectangular shape. As can be seen, there are 4 patterns of first overlay marks 60 having 6 elongated bodies in each pattern, and 4 patterns of second overlay marks 70 have 6 elongated bodies in each pattern. It is to be appreciated that the first overlay marks 60 are seen through the second dielectric layer 62, where the second dielectric layer is not illustrated in FIG. 9. The relative positioning of the first and second overlay marks 60, 70 may be observed during BEOL fabrication (metrology) to determine the accuracy of the positioning of the components formed in the second dielectric layer 62 relative to the components formed in the first dielectric layer 52. It has been found that the use of 5 elongated bodies or even 4 elongated bodies in each pattern are adequate for alignment purposes when the first and second blocks 32, 34 are separated by the pillar 44, as described above.

Figure 10:
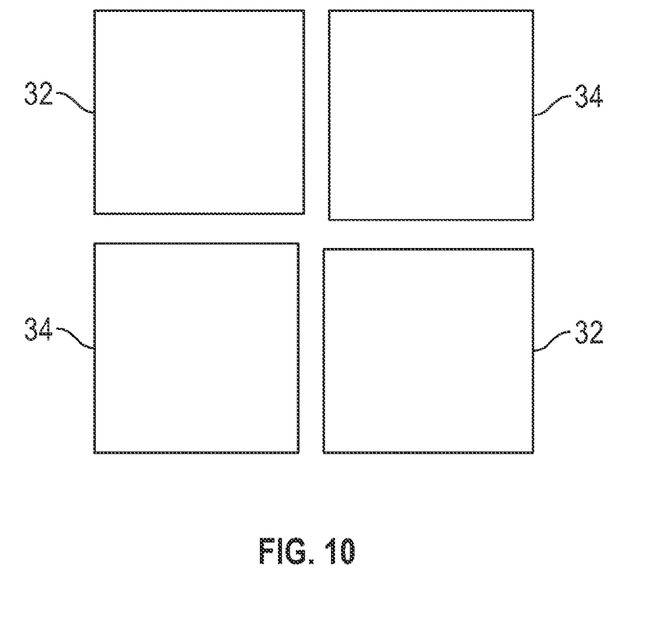
FIGS. 10 and 11 are top views of different embodiments for the first and second blocks.
Figure 11:
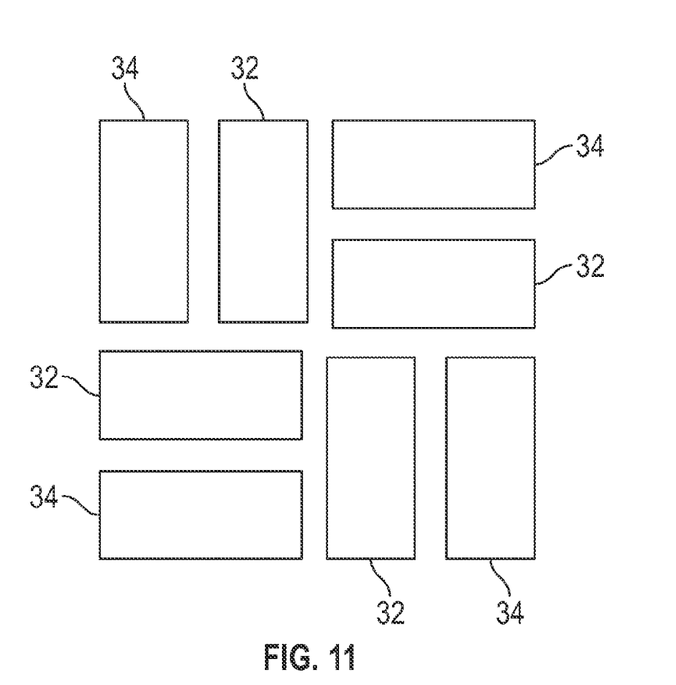

Reference is made to FIGS. 9-11, where FIGS. 10 and 11 are top views of different embodiments taken along section line 10-10 from FIG. 8. FIGS. 10 and 11 illustrate two different embodiments for the first and second blocks 32, 34 associated with the first and second overlay marks 60, 70 illustrated in FIG. 9. An embodiment with 2 first blocks 32 and 2 second blocks 34 is illustrated in FIG. 10. The 2 first blocks 32 in FIG. 10 are positioned kitty corner directly underlying the patterns of first and second overlay marks 60, 70 illustrated horizontally in FIG. 9, and the 2 second blocks 34 in FIG. 10 are positioned kitty corner directly underlying the patterns of first and second overlay marks 60, 70 illustrated vertically in FIG. 9. An alternate embodiment with 4 first blocks 32 and 4 second blocks 34 is illustrated in FIG. 11. The 4 first blocks 32 in FIG. 11 are positioned directly underlying the 4 sets of first overlay marks 60 illustrated in FIG. 9, and the 4 second blocks 34 in FIG. 11 are positioned directly underlying the 4 sets of second overlay marks 70 illustrated in FIG. 9. Alternate embodiments for the first and second overlay marks 60, 70 are also possible, including but not limited to embodiments where the first overlay mark 60 is a box and the second overlay mark 70 is a frame positioned around the first overlay mark 60.

Figure 12:
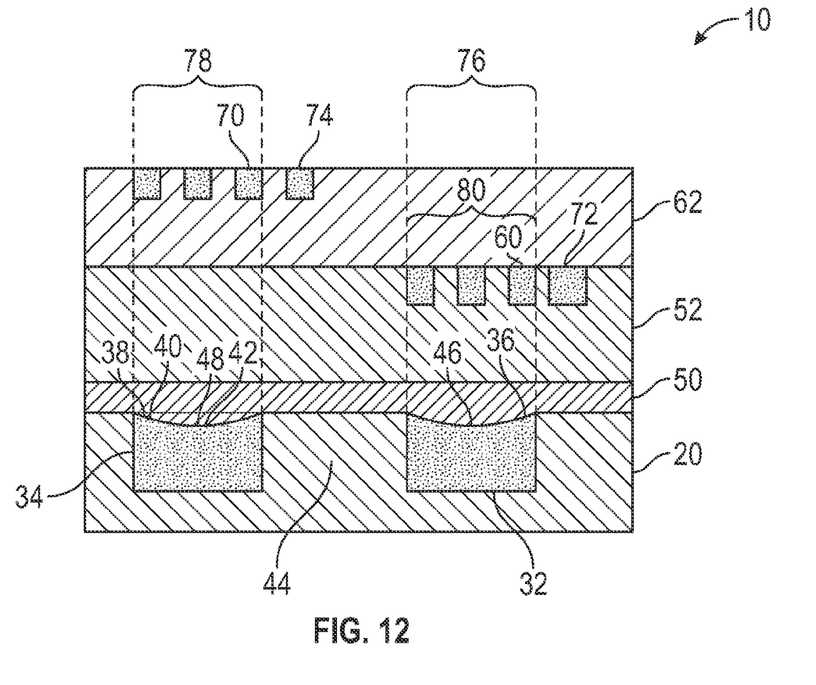
FIG. 12 is a cross-sectional view illustrating a portion of an integrated circuit in accordance with another exemplary embodiment.
Figure 13:
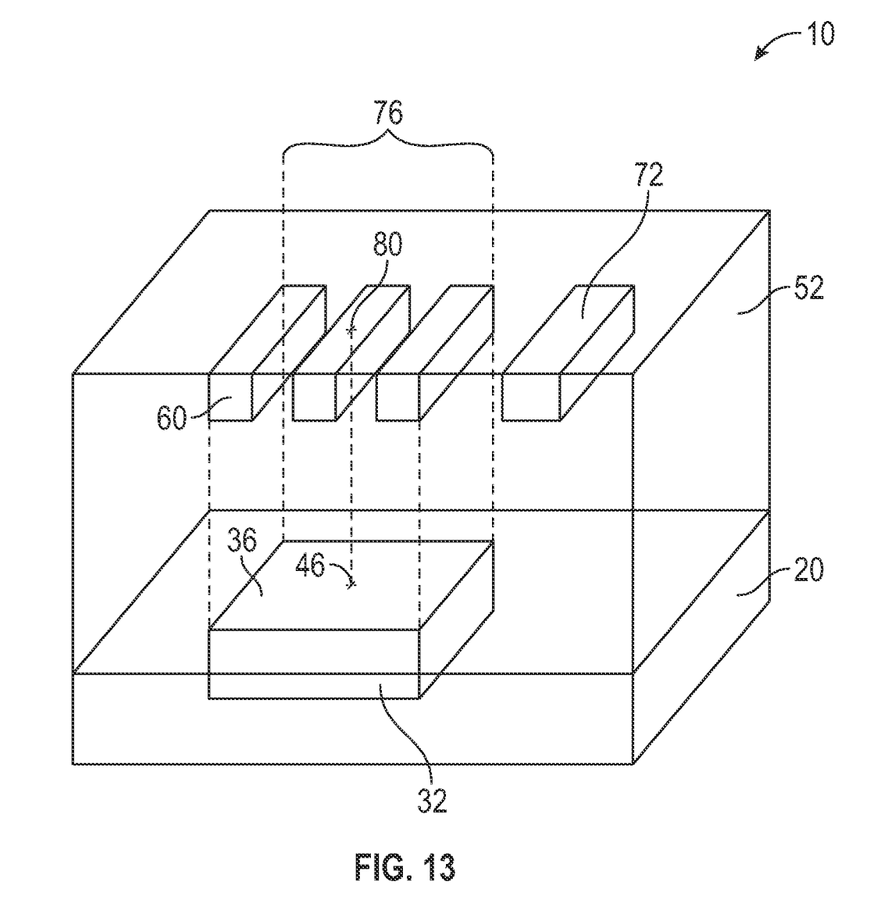
FIG. 13 is a perspective sectioned view of a portion of the integrated circuit of FIG. 12 illustrating a first overlay mark pattern.

An alternate embodiment is illustrated in FIGS. 12 and 13, where FIG. 12 is a side sectional view and FIG. 13 is a perspective view of a section of the first dielectric layer 52 and a section of the base dielectric layer 20 that includes the first overlay mark 60 and the first block 32. A first label 72 is positioned proximal to the first overlay mark 60, such as within about 5 micrometers of the first overlay mark 60 or within about 3 micrometers of the first overlay mark 60, or within about 2 micrometers of the first overlay mark 60 in various embodiments. A second label 74 is similarly positioned proximal to the second overlay mark 70, such as within about 5 micrometers of the second overlay mark 70 or within about 3 micrometers of the second overlay mark 70, or within about 2 micrometers of the second overlay mark 70 in various embodiments. The first and second blocks 32, 34 are reduced in size such that the first and second labels 72, 74 do not directly overlie the first and second blocks 32, 34. As such, the first and second labels 72, 74 directly overlay a portion of the base dielectric layer 20 within which the first and second blocks 32, 34, respectively, are not disposed. In other words, the first and second labels 72, 74 directly overlay a portion of the base dielectric layer 20 other than the position of the first and second blocks 32, 34, respectively.

The first overlay mark(s) 60 is/are positioned within a first overlay mark pattern 76, and the second overlay mark(s) 70 is/are positioned within a second overlay mark pattern 78. The first overlay mark pattern 76 has a first overlay mark pattern area, and the first block 32 has a first block area within about 20 percent of the first overlay mark pattern area. The first block area is within about 20 percent of the first overlay mark pattern area if: ((the absolute value of the difference between the first overlay mark pattern area minus the first block area) divided by the first overlay mark pattern area) is less than about 0.2. The first overlay mark pattern 76 is defined by the outside edges of the first overlay mark 60, or the plurality of first overlay marks 60 as illustrated in FIGS. 12 and 13, so the first block 32 is sized to essentially match the area encompassed by the first overlay mark(s) 60. As such, a first overlay mark pattern geographic center 80 is vertically aligned with the first block geographic center 46, such as within about 5 nanometers of the first block geographic center 46, or about 3 nanometers of the first block geographic center 46, or about 1 nanometer of the first block geographic center 46 in various embodiments. As used herein, the term "vertically aligned" means a vertical line passes through both referenced points, or within the specified distance of both referenced points. When the first block 32 is vertically aligned with the first overlay mark pattern 76, the curved area 40 of the first block upper surface 36 is symmetric with the first overlay mark pattern 76, and this minimizes any shifting of the apparent position of the first overlay mark pattern geographic center 80 and the associated first overlay mark(s) 60 during metrology. The first label 72 is used to identify the first overlay mark(s) 60, so a shift in the apparent position of the first label 72 does not influence the apparent position of the first and second overlay marks 60, 70 that are used to determine if there is any misalignment between the first and second dielectric layers 52, 62 and the associated components.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
   a base dielectric layer;
   a first dielectric layer overlying the base dielectric layer;
   a second dielectric layer overlying the first dielectric layer;
   a first overlay mark pattern positioned within the first dielectric layer;
   a second overlay mark pattern positioned within the second dielectric layer, wherein the second overlay mark pattern is offset from the first overlay mark pattern; and
   a first block and a second block positioned within the base dielectric layer, wherein the first overlay mark pattern directly overlays the first block, wherein the first block comprises a first block geographic center, wherein the second overlay mark pattern directly overlays the second block, wherein the first block comprises a first block upper surface that is dished with a trough area and a curved area, wherein the first block geographic center is within the trough area, and wherein the curved area of the first block upper surface is symmetric with the first overlay mark pattern.

2. The integrated circuit of claim 1 wherein the first block and the second block comprise copper.

3. The integrated circuit of claim 1 further comprising an interconnect positioned within the first dielectric layer, wherein the first overlay mark pattern comprises a plurality of first overlay marks, and wherein the interconnect and the plurality of first overlay marks comprise the same material.

4. The integrated circuit of claim 1 wherein the first overlay mark pattern and the second overlay mark pattern comprise a plurality of elongated bodies.

5. The integrated circuit of claim 1 further comprising an electronic component, wherein the base dielectric layer overlies the electronic component.

6. The integrated circuit of claim 1 further comprising a substrate, wherein the substrate comprises monocrystalline silicon, and wherein the base dielectric layer overlies the substrate.

7. The integrated circuit of claim 1 wherein the first block is electrically isolated from the second block.

8. The integrated circuit of claim 1 further comprising a pillar positioned between the first block and the second block, wherein the pillar is contiguous with the base dielectric layer.

9. The integrated circuit of claim 1 wherein the first block and the second block are opaque.

10. The integrated circuit of claim 1 wherein the first and second dielectric layers are translucent.

11. The integrated circuit of claim 1 wherein the first block and the second block are about 4 micrometers or less from each other.

12. An integrated circuit comprising:
a base dielectric layer;
a first dielectric layer overlying the base dielectric layer;
a second dielectric layer overlying the first dielectric layer;
a first overlay mark pattern positioned within the first dielectric layer, wherein the first overlay mark pattern has a first overlay mark pattern area;
a second overlay mark positioned within the second dielectric layer;
a first label positioned within the first dielectric layer proximal to the first overlay mark pattern; and
a first block positioned within the base dielectric layer, wherein the first overlay mark pattern directly overlays the first block and the first label directly overlays a portion of the base dielectric layer at a position other than that of the first block, wherein the first block has a first block area that is within about 20 percent of the first overlay mark pattern area;
a second block positioned within the base dielectric layer, wherein the second overlay mark directly overlays the second block; and
a second label positioned within the second dielectric layer proximal to the second overlay mark, wherein the second label directly overlays the base dielectric layer at a position other than that of the second block.

13. The integrated circuit of claim 12 wherein:
the first overlay mark pattern comprises a first overlay mark pattern geographic center; and
wherein the first block comprises a first block geographic center that is vertically aligned within about 5 nanometers of the first overlay mark pattern geographic center.

14. The integrated circuit of claim 13 wherein the first block comprises a first block upper surface that is dished with a trough area and a curved area, and wherein the first block geographic center is within the trough area.

15. The integrated circuit of claim 12 wherein:
the first overlay mark pattern comprises a first overlay mark; and
wherein an area of the first overlay mark is less than the first block area.

16. The integrated circuit of claim 12 further comprising an electronic component, wherein the base dielectric layer overlies the electronic component.

17. The integrated circuit of claim 12 wherein the first overlay mark pattern comprises a plurality of elongated bodies.

18. The integrated circuit of claim 12 wherein the first block and the second block are electrically isolated from each other.

19. A method of producing an integrated circuit comprising:
forming a first block cavity and a second block cavity within a base dielectric layer;
forming a first block in the first block cavity and a second block in the second block cavity, wherein the first block comprises a first block upper surface that is dished with a trough area and a curved area, and wherein the first block comprises a first block geographic center that is within the trough area;
forming a first dielectric layer overlying the base dielectric layer;
forming a first overlay mark pattern directly overlying the first block in the first dielectric layer, wherein the first overlay mark pattern has a first overlay mark pattern area that is within about 20 percent of a first block area, and wherein the first overly mark pattern comprises a first overlay mark pattern geographic center that is vertically aligned within about 5 nanometers of the first block geographic center;
forming a second dielectric layer overlying the first dielectric layer; and
forming a second overlay mark pattern in the second dielectric layer directly overlying the second block, wherein the second overlay mark pattern has a second overlay mark pattern area that is within about 20 percent of a second block area.

\* \* \* \* \*